(12) United States Patent
Mark et al.

(10) Patent No.: US 7,363,560 B1
(45) Date of Patent: Apr. 22, 2008

(54) CIRCUIT FOR AND METHOD OF DETERMINING THE LOCATION OF A DEFECT IN AN INTEGRATED CIRCUIT

(75) Inventors: David Mark, San Jose, CA (US); Yuezhen Fan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 334 days.

(21) Appl. No.: 11/064,129

(22) Filed: Feb. 23, 2005

Related U.S. Application Data

(63) Continuation-in-part of application No. 10/703,326, filed on Nov. 7, 2003, now Pat. No. 7,145,344, which is a continuation-in-part of application No. 10/280,611, filed on Oct. 25, 2002, now Pat. No. 6,889,368.

(51) Int. Cl.
*G01R 31/28* (2006.01)
*G01R 31/26* (2006.01)
*G06F 7/38* (2006.01)
*H03K 19/096* (2006.01)

(52) U.S. Cl. .................. 714/725; 324/528; 324/765; 326/39; 326/96

(58) Field of Classification Search .................. None
See application file for complete search history.

(56) References Cited

U.S. PATENT DOCUMENTS

| | | | |
|---|---|---|---|
| 4,194,113 A | 3/1980 | Fulks et al. | |
| 5,596,587 A | 1/1997 | Douglas et al. | |
| 5,790,479 A | 8/1998 | Conn | |
| 5,963,046 A | 10/1999 | Konuk | |
| 5,976,898 A | 11/1999 | Marty et al. | |
| 6,005,829 A | 12/1999 | Conn | |
| 6,069,849 A | 5/2000 | Kingsley et al. | |
| 6,075,418 A | 6/2000 | Kingsley et al. | |
| 6,122,209 A | 9/2000 | Pass et al. | |
| 6,144,262 A | 11/2000 | Kingsley | |
| 6,157,210 A | 12/2000 | Zaveri et al. | |
| 6,219,305 B1 | 4/2001 | Patrie et al. | |
| 6,232,845 B1 | 5/2001 | Kingsley et al. | |

(Continued)

OTHER PUBLICATIONS

Mark et al., Localizing Open Interconnect Defects using Targeted Routing in FPGA's, Feb. 2004, IEEE, Paper 22.1, pp. 627-634.*

(Continued)

*Primary Examiner*—Cynthia Britt
*Assistant Examiner*—John J. Tabone, Jr.
(74) *Attorney, Agent, or Firm*—John J. King

(57) ABSTRACT

According to one aspect of the invention, a circuit for determining the location of a defect in an integrated circuit is described. The circuit comprises a conductor extending from a first node to a second node and a test signal driver coupled to the first node of the conductor. The test signal driver receives a test signal using a first clock signal, while a plurality of detector circuits coupled to the conductor between the first node and the second node to detect an output at the plurality of nodes using a second clock signal. According to other embodiments, circuits for determining the location of a defect in a programmable logic device are disclosed. Finally, various methods for determining the location of a defect in an integrated circuit are described.

18 Claims, 5 Drawing Sheets

U.S. PATENT DOCUMENTS

| | | |
|---|---|---|
| 6,233,205 B1 | 5/2001 | Wells et al. |
| 6,278,291 B1 | 8/2001 | McClintock et al. |
| 6,425,077 B1 | 7/2002 | Le et al. |
| 6,452,459 B1 | 9/2002 | Chan et al. |
| 6,466,520 B1 | 10/2002 | Speyer et al. |
| 6,477,115 B1 * | 11/2002 | Inoshita et al. ............. 368/120 |
| 6,509,739 B1 | 1/2003 | Voogel et al. |
| 6,530,071 B1 | 3/2003 | Guccione et al. |
| 6,536,007 B1 | 3/2003 | Venkataraman |
| 6,570,181 B1 | 5/2003 | Graas et al. |
| 6,574,761 B1 | 6/2003 | Abramovici et al. |
| 6,691,267 B1 | 2/2004 | Nguyen et al. |
| 6,775,817 B2 | 8/2004 | Ono et al. |
| 6,817,006 B1 | 11/2004 | Wells et al. |

OTHER PUBLICATIONS

U.S. Appl. No. 10/703,326, filed Nov. 7, 2003, Mark et al.

U. S. Appl. No. 10/280,611, filed Oct. 25, 2002, Mark et al.

* cited by examiner

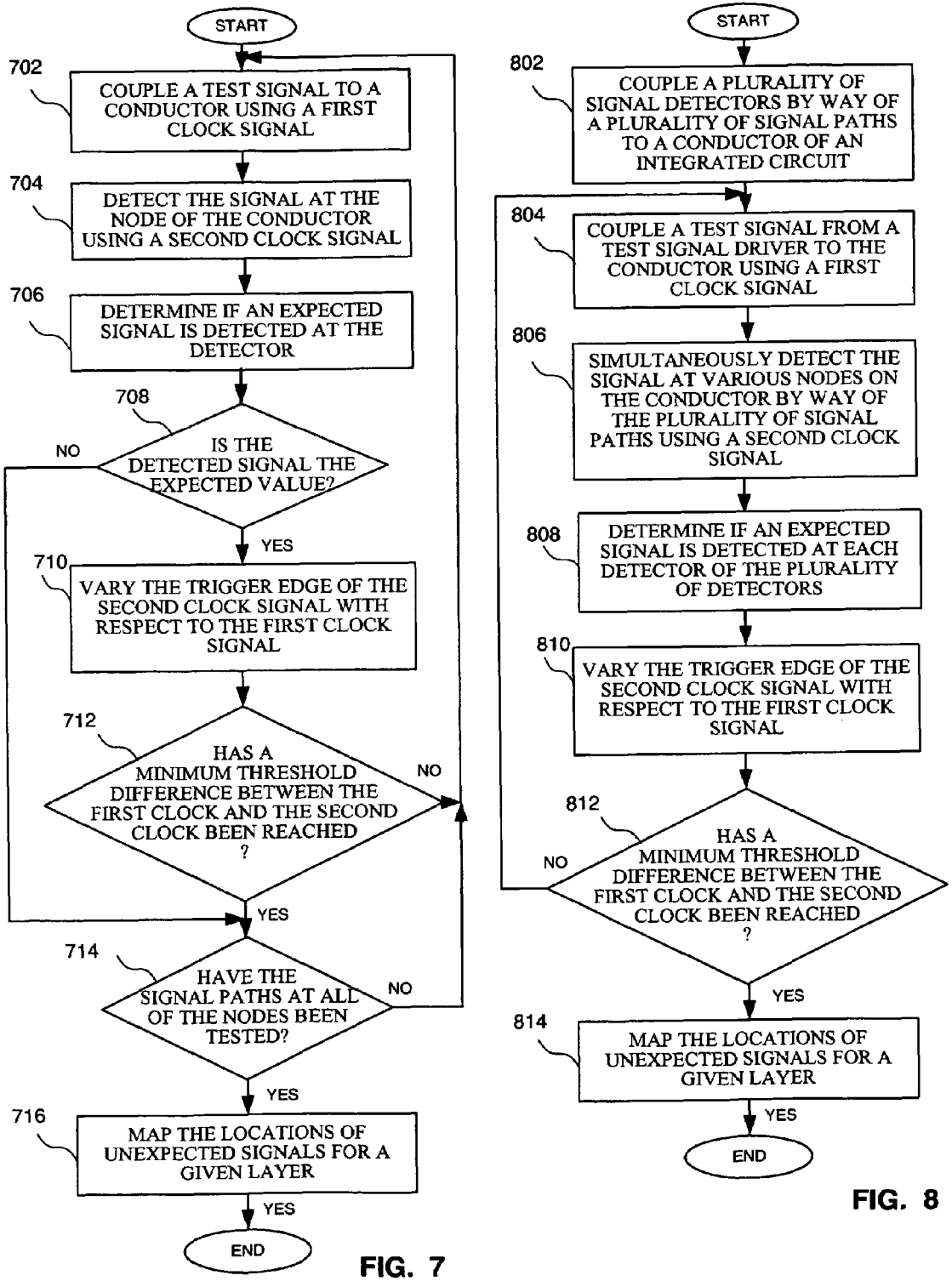

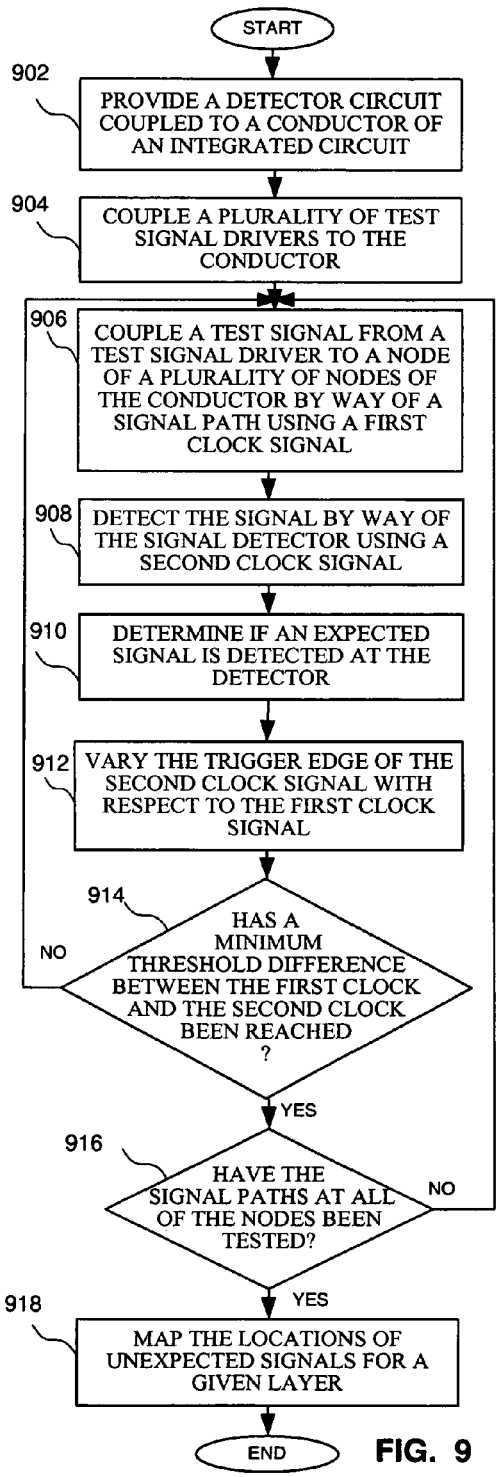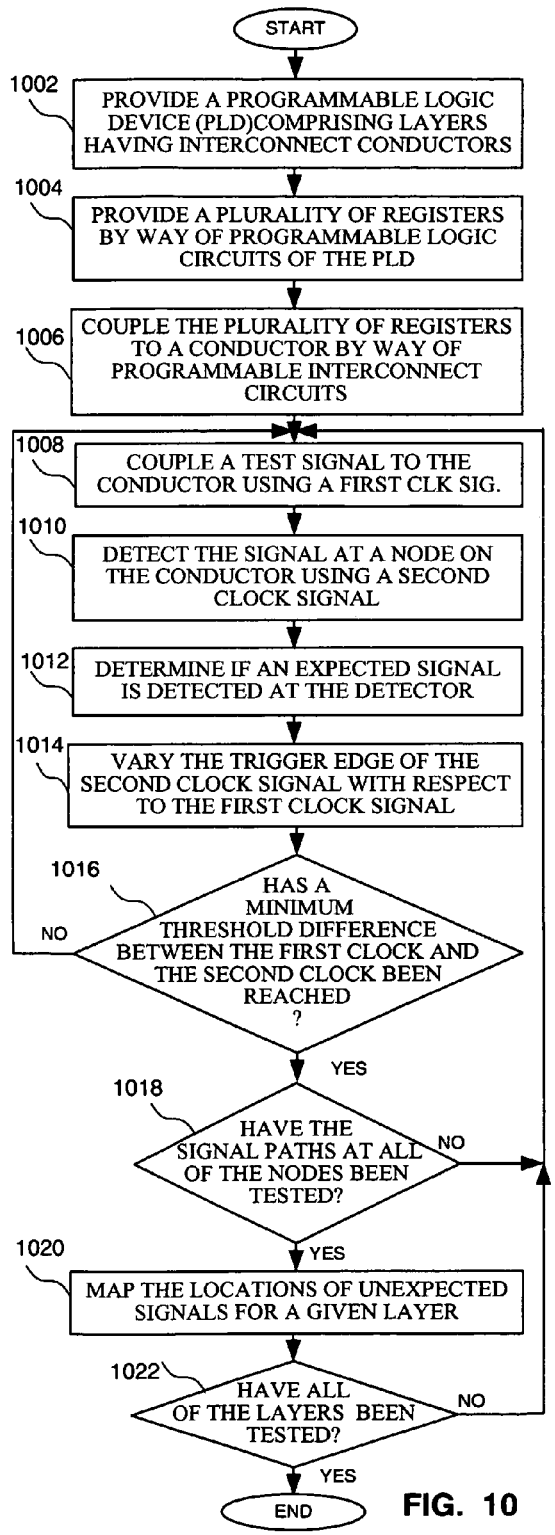
FIG. 9
FIG. 10

CIRCUIT FOR AND METHOD OF DETERMINING THE LOCATION OF A DEFECT IN AN INTEGRATED CIRCUIT

CROSS REFERENCE

This application is a continuation-in-part of the following two commonly assigned U.S. patent applications, both of which are herein incorporated by reference: 1) Ser. No. 10/280,611, entitled "Method and Apparatus for Localizing Faults within a Programmable Logic Device", by David Mark, et. al., filed Oct. 25, 2002, and 2) Ser. No. 10/703,326, entitled "Method and Circuits for Localizing Defective Interconnect Resources in Programmable Logic Devices", by David Mark, et. al., filed Nov. 7, 2003.

FIELD OF THE INVENTION

The present invention relates generally to integrated circuits, and in particular, to a circuit for and a method of determining the location of a defect in an integrated circuit.

BACKGROUND OF THE INVENTION

In manufacturing semiconductor devices, it is important that the devices are free of defects at the time of production, and reliable throughout their use. When defects are found in a die on a wafer, the percentage of usable die decreases, and the profitability of the manufacturer is impacted. More importantly, when a completed semiconductor device fails after it has been installed in a finished product, such as a consumer electronics product, the failure of the semiconductor device can cause the entire product to fail. That is, the failure of a single semiconductor device can render an entire consumer electronics device unusable. Accordingly, it is important that manufacturers of semiconductor devices identify and eliminate defects whenever possible.

Most semiconductor devices are built up using a number of material layers. Each layer is patterned to add or remove selected portions to form circuit features that will eventually make up a complete integrated circuit. The patterning process, such as photolithography, defines the dimensions of the circuit features. Modern semiconductor devices have a significant number of layers formed using complex sequences of process steps. Because problems encountered in the formation of any one layer can render an entire device defective, defective devices are therefore tested to physically locate defects. One goal of testing devices is to identify defective layers, which helps to troubleshoot device processes.

Some semiconductor devices, such as field programmable gate arrays (FPGAs) or complex programmable logic device (CPLDs) (collectively known as programmable logic devices (PLDs)), include extensive routing resources. The routing resources are typically collections of parallel metal lines, also commonly called "conductors," "interconnect lines," or "interconnects," formed using overlapping and isolated metal layers. Insulating layers separate the metal layers, enabling the metal lines to comprise interconnect lines between different layers by making contact through "vias" that extend through the insulating layers.

Conventional FPGA interconnect designs typically allow some metal lines in certain layers to be analyzed by components of the circuit. For example, conventional ring oscillator patterns are designed for detecting a defective conductor. A group of failure analysis (FA) test patterns called Metal-FA-Patterns is used to test each specific single metal interconnect layer. The Metal-FA-Patterns are used to monitor the quality of the process to form the physical metal layer by using post process pass/fail results from wafers, and provide quick feedback to process engineers for yield enhancement.

One important element of interconnect designs of an FPGA is a via coupling metal lines on different metal layers. However, conventional ring oscillator patterns are designed for the pass/fail production test environment with no fault localization ability. The ring oscillators tend to use many resources and obtain an average delay time within the conductors under test. Localizing the fault using conventional ring oscillator patterns requires debugging where the extra delay occurs within the design. In addition to taking up much more resources, conventional ring oscillators average out the delays, and therefore do not provide accurate information to determine whether a defect exists in a via.

Accordingly, there is a need for an improved test circuit for and method of detecting a defect in an integrated circuit, and in particular a circuit and method to measure individual interconnect delays across the die to identify specific resistive paths.

SUMMARY OF THE INVENTION

According to one aspect of the invention, a circuit for determining the location of a defect in an integrated circuit is described. The circuit comprises a conductor extending from a first node to a second node and a test signal driver coupled to the first node of the conductor. The test signal driver receives a test signal using a first clock signal, while a plurality of detector circuits coupled to the conductor at a plurality of third nodes between the first node and the second node detect one or more outputs at the plurality of third nodes using a second clock signal.

According to another embodiment of the invention, the circuit for determining the location of a defect is implemented in an integrated circuit comprising a plurality of layers having conductors. A conductor of a layer extends from a first node to a second node, while a plurality of vias each extend through at least one layer to the conductor. A test signal driver is coupled to the conductor and receives a test signal using a first clock signal. Finally, a plurality of detector circuits is coupled to the plurality of vias, where the plurality of detector circuits receives an output of the test circuit using a second clock signal.

According to a further embodiment of the invention, a method of determining the location of a defect in an integrated circuit is disclosed. The method comprises steps of coupling an input signal using a first clock signal to a first end of a conductor extending between a first node and a second node; detecting a signal at a plurality of detectors coupled to a plurality of nodes between the first node and the second node using a second clock signal; varying a trigger edge of the second clock signal with respect to a trigger edge of the first clock signal; and determining the location of a defect in the conductor. The circuits and methods of the present invention enable detecting and localizing interconnect delay faults within the die, which is useful for yield improvement. The information may also be used to map interconnect delays to measure uniformity across the die.

BRIEF DESCRIPTION OF THE DRAWINGS

FIG. 7 is a flow chart of a method of detecting a defect in a conductor according to an embodiment of the present invention;

FIG. 8 is a flow chart of a method of probing a conductor to detect a defect according to an embodiment of the present invention;

FIG. 9 is a flow chart of a method of driving a conductor to detect the location of a defect according to an embodiment the present invention; and FIG. 10 is a flow chart of a method of detecting the location of a defect in a conductor of a programmable logic device according to an embodiment the present invention.

DETAILED DESCRIPTION OF THE DRAWINGS

The various embodiments of the present invention enable the detection of a defect in a conductor of an integrated circuit. While the circuits and methods find particular application in a programmable logic device, the circuits and methods could be employed in any integrated circuit enabling design for testability (DFT). One example of an integrated circuit which finds particular use for the circuits and methods of the present invention is a programmable logic device, such as an FPGA. Specific implementations of the circuits of the present invention are described with respect to an FPGA. While programmable logic devices comprise circuits which provide advantages in implementing the circuits and methods of the invention, it should be understood that the circuits and methods could be employed in other types of integrated circuits.

Figure 1:
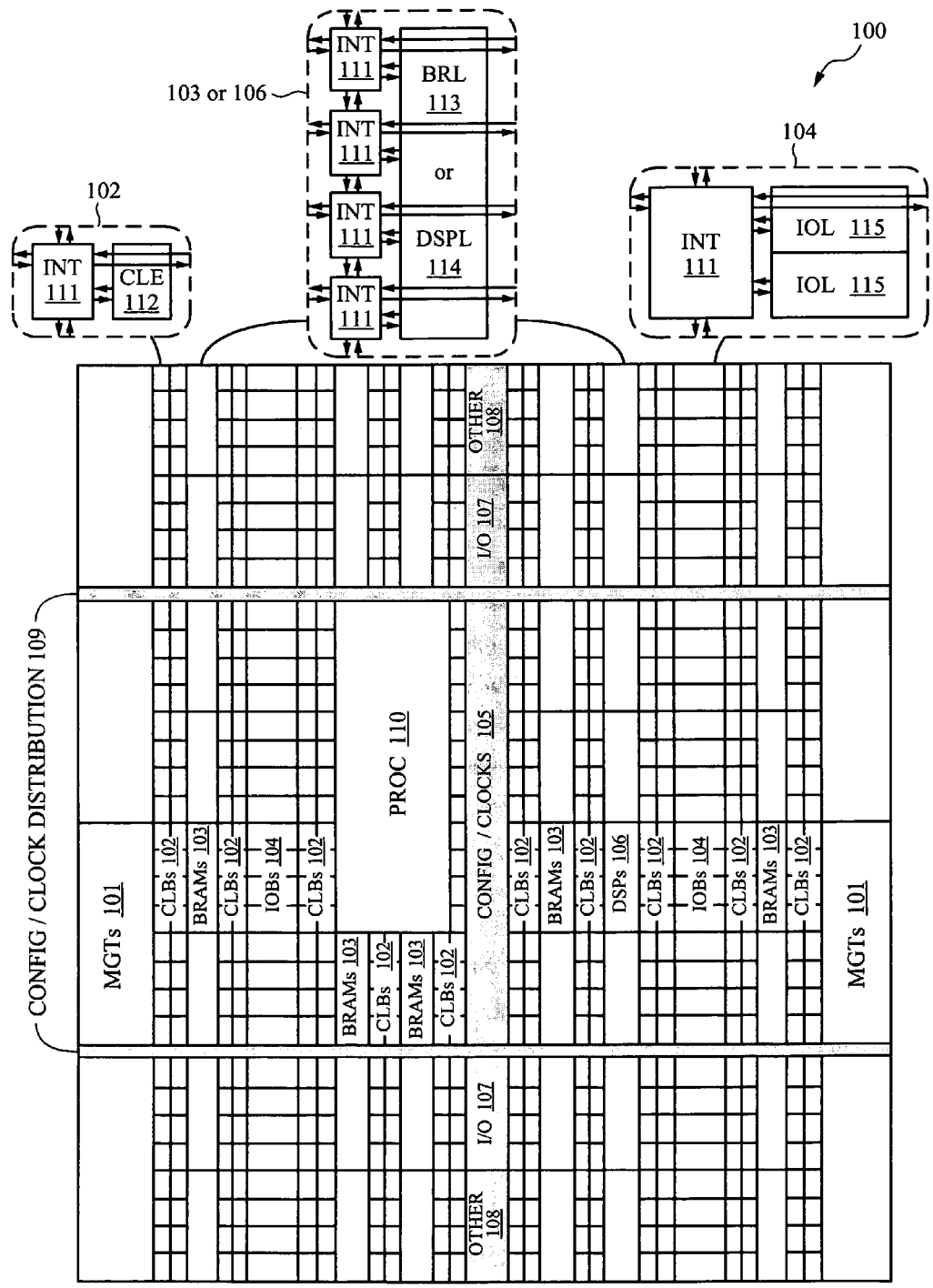
FIG. 1 is a plan view of an integrated circuit showing the arrangement of circuit elements according to an embodiment of the present invention.

A block diagram of a circuit for implementing embodiments of the present invention is shown in FIG. 1. In particular, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

The layers of the circuit of FIG. 1 could be grouped. For example, the first group of layers could be the various functional blocks comprising a programmable logic portion, such as BRAM or CLBs of a programmable logic device, while the interconnect circuits could be positioned in a second group of layers. The interconnect layers could be formed to generally have a common length of conductor, where even layers of the interconnect layers could be used to route signals in a vertical direction, while odd layers could be used to route signals in a horizontal direction.

Note that FIG. 1 is intended to illustrate only an exemplary FPGA architecture. The circuit of FIG. 1 could be a programmable logic device commercially available from Xilinx, Inc., of San Jose, Calif., for example. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic. Similarly the circuits and methods of the present invention could be implemented in any device, including any type of programmable logic device, having memory.

Figure 2:
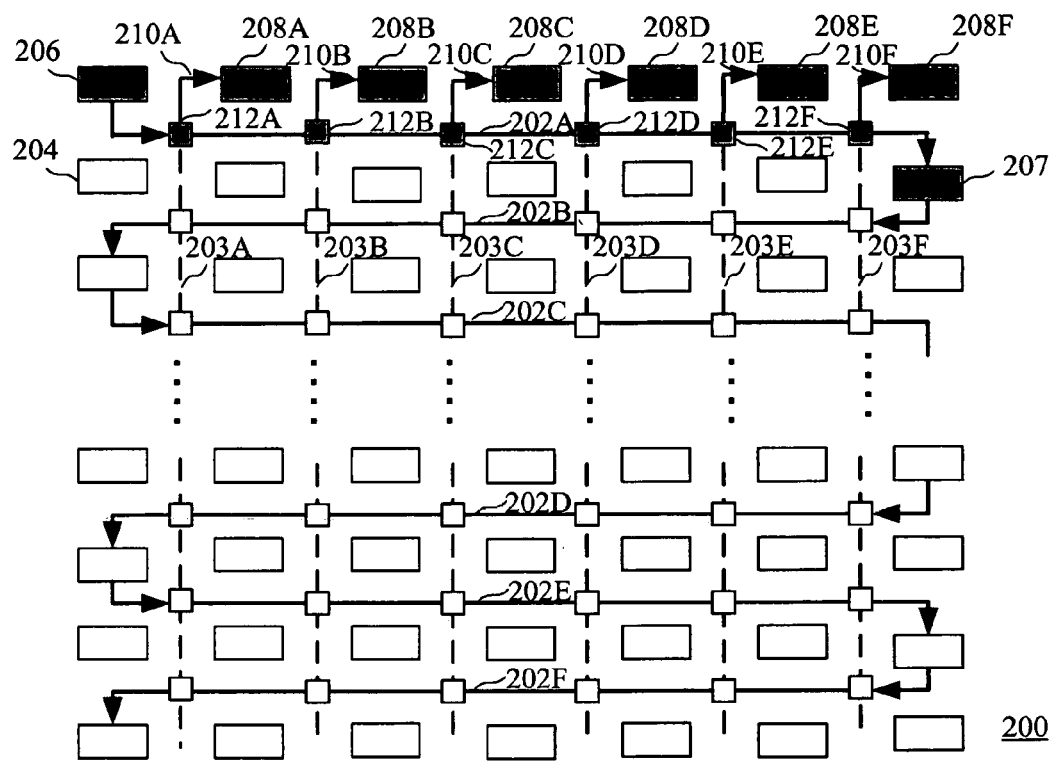
FIG. 2 is a block diagram of a circuit for determining the location of a defect in a conductor of an integrated circuit according to an embodiment of the present invention.

Turning now to FIG. 2, a block diagram of a circuit for determining the location of a defect in a conductor, such as a via, of an integrated circuit is shown. In particular, FIG. 2 shows a programmable logic device (PLD) 200 having a layer comprising conductors 202A-202F extending horizontally. The conductors 202A-202F are long conductors because they extend substantially from a first end of the circuit to a second end of the circuit. Long conductors programmably connect components which are on other layers and are spaced farther apart. Conductors 203A-F (shown in dashed lines extending in a vertical direction) are formed on another layer. Although long conductors are shown by way of example, the circuits and methods described in the present application could be used with other types of conductors.

Figure 3:
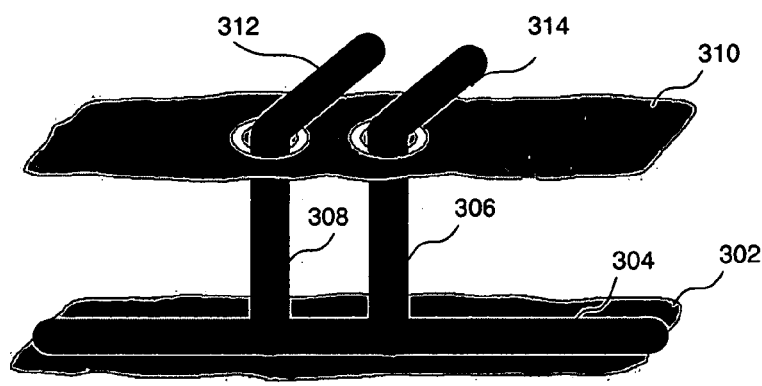
FIG. 3 is a diagram of layers of an integrated circuit having a conductor on a layer and coupled to a plurality of signal lines on a separate layer by vias according to an embodiment of the present invention.

PLD 200 further comprises an array of configurable logic blocks (CLBs), for example, CLB 204. A first configurable logic block 206 comprising a test signal driver and a second configurable logic block 207 comprising a signal detector are coupled on opposite ends of a conductor 202A. A plurality of configurable logic blocks 208A-F are coupled to the conductor 202A by programmable interconnect resources comprising interconnect lines 210A-F and corresponding vias 212A-F. The vias could be stand-alone vias, or a part of programmable interconnect points (PIPs). An example of interconnect lines having vias connecting a conductor on one layer to a conductor on another layer is shown in FIG. 3. In particular, an insulating layer 302 has a conductor 304 which could be, for example, conductor 202A of FIG. 2, and could be coupled between a test signal driver and a signal detector. A pair of interconnect lines are coupled to the conductor by vias 306 and 308 which are coupled through an insulating layer to conductors 312 and 314, respectively. Conductors 312 and 314, which could be two of the conductors 210, are coupled to detectors circuits, which could be implemented in CLBs 208 of FIG. 2, for example. Although two vias are shown by way of example for connecting conductors 312 and 314 to conductor 304, any number of vias could be used. A more detailed example of circuits for detecting signals on the conductor 302 by way vias 306 and 308 will be described in reference to FIG. 4 below.

Figure 4:
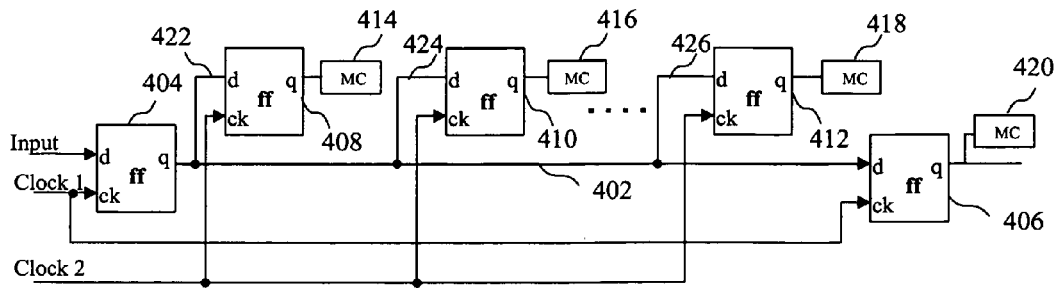
FIG. 4 is a block diagram of a circuit for determining the location of a defect in a conductor according to the embodiment of FIG. 2.

Each CLB preferably comprises configuration memory cells, the contents of which determine the configuration of CLBs and any programmable interconnect resources. Specific programmable logic blocks and programmable interconnect resources which are used to implement the circuit of FIG. 4 are shaded. However, it should be understood that the circuits and methods of determining the location of a defect in a via could be employed in any portion of the PLD. For example, the CLBs could be used to defect a defect in any of the vias coupled to any of the conductors 202A-F, or all of the conductors simultaneously.

To identify interconnect defects in PLD 200, test circuits are instantiated into PLD 200. In the example of FIG. 2, a test signal driver and a signal detector could be instantiated in CLBs 206 and 207, respectively, on opposite ends of conductor 202A. During operation, CLB 206 transmits test signals to CLB 207. Data detected by CLBs 208A-F are then compared with the expected data to determine if a defect exists. As will be described in more detail below, the timing of the detector circuits is varied to enable the determination of defective vias in the integrated circuit. Although the example of FIG. 2 shows detecting the identity of a defect in conductor 202A of a given layer, it should be understood that the circuit could be implemented on each layer of the integrated circuit having metal interconnect lines.

Turning now to FIG. 4, a block diagram of a circuit for determining the location of a defect in a conductor, such as a via, according to the embodiment of FIG. 2 is shown. In particular, a conductor 402 is coupled between a test signal driver comprising a register (flip-flop or ff) 404 and a signal detector comprising a register (ff) 406. A plurality of signal detectors comprising registers (flip-flops or ffs) 408, 410 and 412 are coupled to receive a signal from the conductor 402. The outputs of the registers are coupled to memories (MCs) 414, 416, and 418, respectively, to store values which are latched by the registers. The inputs of registers 408-412 are coupled to conductor 402 by way of interconnect lines 422, 424, and 426, respectively, each of which comprises a via. The register 404 receives a test signal at an input using a first clock (Clock 1), and outputs a signal to the register 406, which also receives the first clock signal. However, the signal detectors 408-412 are clocked using a second clock signal (Clock 2). The second clock signal is varied with respect to the first clock signal to determine whether a via is defective based upon a resistance value of the via. As the time between a triggering edge of a second clock signal and a first clock signal is decreased, a register for detecting a signal coupled to the conductor may not be able to latch the correct signal because of the resistance of the via.

In particular, as the difference between the clock pulses decreases, the total of the clock-to-out (Tcko), net delay, and setup (Tdyck) times will be violated. The delay for each wire segment having a via can therefore be measured as the clock difference is narrowed. The measurement from each register is subtracted from the measurement for the next register to get the delay for the wire segment between the registers. The conductor having extra delay will be identified after post processing the measurement data. Accordingly, defective vias can be detected by varying the clock signals, and in particular by decreasing the period between the triggering edge of the first clock signal and the triggering edge of the second clock signal.

Figure 5:
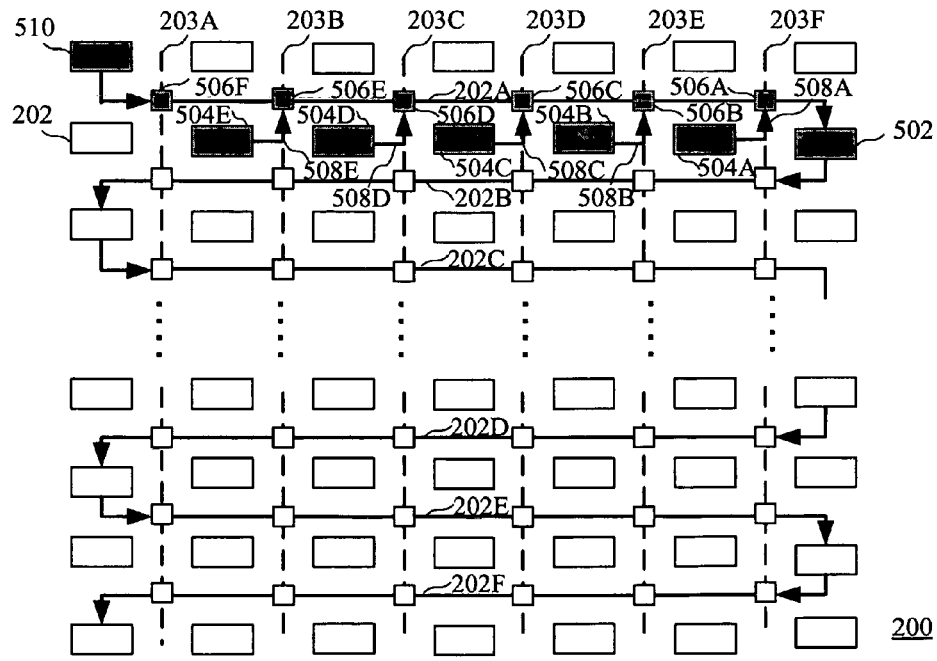
FIG. 5 is a block diagram of a circuit for determining the location of a defect in a conductor according to an alternate embodiment of the present invention.

Turning now to FIG. 5, a block diagram of a circuit for determining the location of a defect in a conductor according to an alternate embodiment of the present invention is shown. According to the embodiment of FIG. 5, rather than probing nodes on the conductor, the circuit of FIG. 5 drives nodes to determine whether an interconnect line has a via which is defective. In particular, a configurable logic block 502 is coupled to conductor 202A to detect a signal on the conductor. A plurality of configurable logic blocks 504A-E are coupled to vias 506A-E, respectively, by interconnect lines 508A-E having vias. Unlike the embodiment of FIG. 2 where the nodes of the conductor are probed simultaneously, only a single node is driven by a configuration logic block 504. To identify interconnect defects in vias in PLD 200, a signal detector could be instantiated in CLB 502 on an end of the circuit. During operation, one of the CLBs 504 transmits test signals to CLB 502. Data detected by CLB 502 is then compared with the expected data to determine if a defect in a via exists, as will be described in more detail in reference to FIG. 6.

Figure 6:
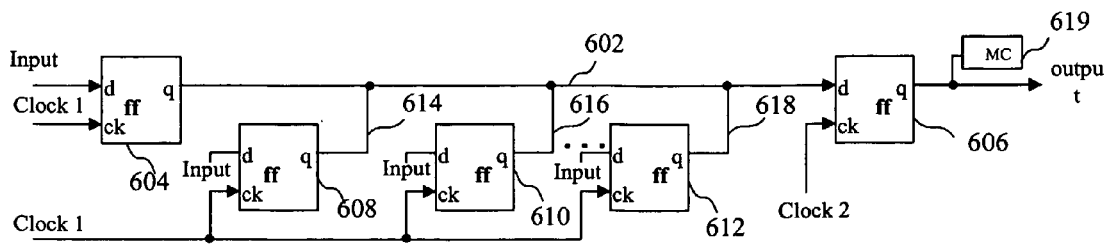
FIG. 6 is a block diagram of a circuit for determining the location of a defect in a conductor according to the embodiment of FIG. 5.

Turning now to FIG. 6, a block diagram of a circuit for determining the location of a defect in a conductor according to the embodiment of FIG. 5 is shown. In particular, a conductor 602 is coupled between a test signal driver comprising a register 604 and a detector comprising a register 606. A plurality of test signal drivers comprising registers 608, 610 and 612 drive nodes by way of interconnect lines 614-618, respectively, each of which comprises a via. The register driving the node of the conductor is clocked by a first clock signal (Clock 1), while the register 606 which is detecting a signal is clocked by a second clock (Clock 2). By varying the difference between the first and second clock signals, it is possible to determine whether a via is defective.

Unlike the circuit of FIG. 2 where the nodes are simultaneously probed by a plurality of detectors, only a single node is driven by a register using the circuit of FIG. 6. In order to detect whether a via coupled to a given node is defective, the time period between trigger edges of a clock signal coupled to a driving register and a clock signal coupled to a detector circuit is decreased. The difference between the clock signals is preferably continuously decreased until an unexpected value is recorded by the detector. A memory 619 is coupled to the detector 606 to store the registered values for the various differences between the clock signals. Accordingly, the resistance for a given via can be characterized by the difference between the clock signals, and a defective via can be identified. Although the circuits of FIGS. 4 and 6 could be implemented on a programmable logic device, the circuits could be employed in any type of integrated circuit.

Turning now to FIG. 7, a flow chart of a method of detecting a defect in a conductor according to an embodiment of the present invention is shown. The method of FIG. 7 could be implemented using any of the circuits of FIGS. 1-6, or any other suitable circuit. A test signal is coupled to a conductor using a first clock signal at a step 702. The signal at a node of the conductor is detected by way of a signal detector using a second clock signal at a step 704. It is then determined if an expected signal is detected at the detector at a step 706. If it is determined that the detected signal is the expected value at a step 708, the trigger edge of the second clock signal is varied with respect to the first clock signal at a step 710. It is then determined whether a minimum threshold difference between the first clock and the second clock has been reached at a step 712. If not, another test signal is coupled to the conductor using the first clock signal at step 702, and detected at a detector using a second clock signal at step 704, where the difference between the first and second clock signals is decreased. If the minimum threshold has been reached, it is determined whether the signal paths at all of the nodes have been tested at a step 714. If all of the signal paths to all of the nodes have been tested, the locations of unexpected signals are mapped for a given layer at a step 716.

Turning now to FIG. 8, a flow chart of a method of probing a conductor to detect a defect according to an embodiment of the present invention is shown. The method of FIG. 8 could be implemented using any of the circuits of FIGS. 2-4, or any other suitable circuit. A plurality of signal detectors is coupled by way of a plurality of signal paths to a conductor of an integrated circuit at a step 802. One or more of the signal paths could include a via between conductors on different metal layers. A test signal from a test signal driver is coupled to the conductor using a first clock signal at a step 804. The signals at various nodes on the conductor are simultaneously detected by way of the plurality of signal paths using a second clock signal at a step 806. It is then determined if an expected signal is detected at each detector of the plurality of detectors at a step 808. The trigger edge of the second clock signal is then varied with respect to the trigger edge of the first clock signal at a step 810. It is then determined whether a minimum threshold difference between the first clock and the second clock has been reached at a step 812. If so, the locations of unexpected signals are mapped for a given layer at a step 814.

Turning now to FIG. 9, a flow chart of a method of driving a conductor to detect the location of a defect according to an embodiment the present invention is shown. The method of FIG. 9 could be implemented using the circuit of FIGS. 5 and 6, or some other suitable circuit. A detector circuit coupled to a conductor of an integrated circuit is provided at a step 902. A plurality of test signal drivers are coupled to the conductor at a step 904. A test signal from a test signal driver is coupled to a node of a plurality of nodes of the conductor by way of a signal path using a first clock signal at a step 906. A signal is detected by way of the signal detector using a second clock signal at a step 908. It is then determined if an expected signal is detected at the detector at a step 910. The trigger edge of the second clock signal is then varied with respect to the first clock signal at a step 912. It is then determined whether a minimum threshold difference between the first clock and the second clock have been reached at a step 914. It is also determined whether all of the nodes have been driven by a test signal driver at a step 916. Finally, the locations of unexpected signals for a given layer are mapped at a step 918.

Finally, turning to FIG. 10, a flow chart of a method of detecting the location of a defect in a conductor of a programmable logic device according to an embodiment the present invention is shown. A programmable logic device comprising a plurality of layers having interconnect conductors is provided at a step 1002. A plurality of registers is provided by way of programmable logic circuits of the programmable logic device at a step 1004. The plurality of registers is coupled to a conductor by way of programmable interconnect circuits at a step 1006. A test signal is coupled to the conductor using a first clock signal at a step 1008. A signal is detected at a node on the conductor using a second clock signal at a step 1010, or preferably by a detector circuit implemented in a programmable logic circuit of the device. It is then determined if an expected signal is detected at the detector at a step 1012. The trigger edge of the second clock signal is varied with respect to the trigger edge first clock signal at a step 1014. It is then determined whether a minimum threshold difference between the trigger edge of the first clock and the trigger edge of the second clock has been reached at a step 1016. It is also determined whether the signal paths at all of the nodes have been tested at a step 1018. The locations of unexpected signals for a given layer are mapped at a step 1020. Finally, it is determined whether all of the layers have been tested at a step 1022.

The circuits and methods of the present invention enable detecting and localizing interconnect delay faults within the die, and particularly, interconnect delay faults caused by defective vias. A contour map of the delays can be generated to measure uniformity across the entire die. Although actual delays may also be associated with transistor parameters, current tilo mapping results can be used to easily take transistor parameters into account. The circuits and methods of the present invention enable localizing single or multiple delay faults for the conductors under test. One benefit to the circuits and methods of the present invention is that it is possible to isolate delay fault to within one segment. Also, because the capture is local, long routing delays from the middle of the chip to an input/output (I/O) for measurement can be avoided, minimizing other routing from affecting the measurement. Also, no I/O's are needed, and data for multiple nodes can be taken at once.

It can therefore be appreciated that the new and novel circuit and method of determining the location of a defect in an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. A circuit for determining the location of a defect in an integrated circuit, said circuit comprising:

a conductor extending from a first node to a second node;

a test signal driver coupled to said first node of said conductor, said test signal driver receiving a test signal using a first clock signal; and a plurality of detector circuits coupled to said conductor at a plurality of third nodes between said first node and said second node, said plurality of detector circuits coupled to detect at least one output at said plurality of third nodes using a second clock signal;

wherein a trigger edge of said second clock signal varies from a trigger edge of said first clock signal by a predetermined period.

2. The circuit of claim 1 wherein said test signal driver comprises a register.

3. The circuit of claim 1 wherein said plurality of detectors comprises a plurality of registers.

4. The circuit of claim 3 further comprising a memory coupled to each register of said plurality of registers.

5. The circuit of claim 1 wherein said test signal driver comprises a configurable logic block of a programmable logic device.

6. The circuit of claim 1 wherein said detector circuits are implemented in configurable logic blocks of a programmable logic device.

7. A circuit for determining the location of a defect in an integrated circuit, said circuit comprising:

a plurality of layers having conductors;

a conductor of a layer extending from a first node to a second node;

a plurality of vias each extending through at least one layer to said conductor;

a test signal driver coupled to said conductor, said test signal driver receiving a test signal using a first clock signal; and a plurality of detector circuits coupled to said plurality of vias, said plurality of detector circuits receiving an output of said test signal driver using a second clock signal;

wherein a trigger edge of said second clock signal varies from a trigger edge of said first clock signal by a predetermined period.

8. The circuit of claim 7 wherein said test signal driver comprises a register implemented in a configurable logic block of a programmable logic device.

9. The circuit of claim 7 wherein said plurality of detector circuits comprises registers implemented in configurable logic blocks of a programmable logic device.

10. A method of determining the location of a defect in an integrated circuit, said method comprising the steps of:

coupling an input signal using a first clock signal to a conductor extending between a first node and a second node;

detecting a signal at a detector coupled to said conductor using a second clock signal;

varying a trigger edge of said second clock signal with respect to a trigger edge of said first clock signal; and determining the location of a defect in said conductor.

11. The method of claim 10 wherein said step of detecting a signal at a detector comprises simultaneously detecting a signal at a plurality of detectors.

12. The method of claim 10 wherein said step of coupling an input signal comprises sequentially coupling an input signal to a test signal driver circuit of a plurality of test signal driver circuits.

13. The method of claim 10 further comprising a step of implementing said detector in a configuration logic block of a configurable logic device.

14. The method of claim 10 wherein said step of varying a trigger edge of said second clock signal with respect to a trigger edge of said first clock signal comprises a step of periodically varying the difference between a trigger edge of said first clock signal and a trigger edge of said second clock signal until a minimum threshold difference has been reached.

15. The method of claim 10 further comprising a step of coupling a plurality of detectors to a plurality of nodes by way of a plurality of vias.

16. The method of claim 15 further comprising a step of determining the location of a via having a defect.

17. The method of claim 15 further comprising a step of mapping the locations of defective vias associated with a given layer.

18. The method of claim 17 further comprising a step of determining an average resistance of a plurality of vias in said integrated circuit.

* * * * *